United States Patent [19]

Ganapathy et al.

[11] Patent Number: 5,630,100

[45] Date of Patent: May 13, 1997

[54] SIMULATING MULTI-PHASE CLOCK DESIGNS USING A SINGLE CLOCK EDGE BASED SYSTEM

[75] Inventors: Gopi Ganapathy; David B. Witt, both of Austin, Tex.

[73] Assignee: Advanced Micro Devices, Inc., Sunnyvale, Calif.

[21] Appl. No.: 323,643

[22] Filed: Oct. 17, 1994

[51] Int. Cl.$^6$ .................................................. G06F 9/455
[52] U.S. Cl. ............................ 395/500; 364/232.3
[58] Field of Search .................. 395/500; 364/232.3, 364/927.81, 578; 327/298

[56] References Cited

U.S. PATENT DOCUMENTS

| | | | |
|---|---|---|---|
| 4,757,264 | 7/1988 | Lee et al. | 328/63 |
| 4,820,992 | 4/1989 | Avis | 328/137 |
| 4,899,273 | 2/1990 | Omoda et al. | 364/200 |
| 4,965,524 | 10/1990 | Patchen | 328/72 |

OTHER PUBLICATIONS

Intel "IAPAX 86/88, 186/188 User's Manual Hardware Reference", pp. 2–44–2–46, 1985.
Brian Case, "AMD Unveils First Superscalar 29K Core", *Microprocessor Report*, Oct. 24, 1994, pp. 23–26.
Michael Slater, "AMD's K5 Designed to Outrun Pentium", *Microprocessor Report*, Oct. 24, 1994, pp. 1, 6–11.

*Primary Examiner*—Kevin J. Teska
*Assistant Examiner*—Leigh Marie Garbowski
*Attorney, Agent, or Firm*—Skjerven, Morrill, MacPherson, Franklin & Friel

[57] ABSTRACT

A method for converting a multiple-phase circuit to single-clock-edge circuit includes the steps of receiving a data signal at an input terminal, receiving a system clock signal having a system clock frequency and receiving a phase clock signal having a frequency divided from the system clock frequency. The data signal is transferred to an output terminal when the phase clock signal is active and latched upon the occurrence of an edge transition of the system clock signal when the phase clock signal is active. When the phase clock signal is inactive, the latched data signal is latched again upon the occurrence of the edge transition of the system clock signal. The latched data signal is transferred to the output terminal when the phase clock signal is inactive.

33 Claims, 7 Drawing Sheets

FIG. 4A $\phi_1$

FIG. 4B $\phi_2$

SIMULATING MULTI-PHASE CLOCK DESIGNS USING A SINGLE CLOCK EDGE BASED SYSTEM

BACKGROUND OF THE INVENTION

1. Field of the Invention

The present invention relates to digital circuits and digital circuit simulation systems and, more particularly, to digital circuits and digital circuit simulation systems which convert a multiple-phase level-sensitive design into a single-clock-edge based system.

2. Description of the Related Art

The design and development of electronic circuits includes the task of building and testing a system prototype. The system prototype may take the form of a breadboard circuit having various degrees of similarity in form and function to the target circuit, a simulated circuit operating on a general purpose computer system, a hardware simulator or emulator and the like. A prototype is generally useful if it is constructed in a suitable time for a reasonable cost, so long as the prototype effectively mimics the function of the target circuit.

The design of highly complex electronic circuits and systems includes an analysis of circuits that contain a large number of active elements. For LSI and VLSI circuits, examination of the total system response involves simulation of hundreds of thousands of circuit elements. Typically simulation of complex circuits is accomplished using a hierarchical approach by analyzing circuits at different levels of abstraction, including simulations at architectural, behavioral, functional, logic and transistor levels. At the architectural level, the abstract definition of the architecture of the circuit is analyzed to set a guideline for the various ways of accomplishing the objective of the circuit. At the behavioral level of simulation, major blocks of the circuit are defined and their interactions are catalogued to examine the details of the overall data or control flow for accomplishing the objective of the circuit. The functional level of simulation describes the overall logical response of the major blocks in the circuit to relate the logical input parameters to output parameters while not considering the details of the internal realization of the logic within the block. The logic level of simulation analyzes each block at the gate level, minimizes logic and in some cases introduces the concept of relative timing. The transistor level simulation examines the transient response of the circuit, including the detailed emulation of all elements within the circuit. Usefulness of the hierarchical simulation is determined by the ability to mix the different levels of abstraction to examine the performance of the entire circuit while analyzing the detailed interactions of circuit elements one block at a time.

Figure 1:
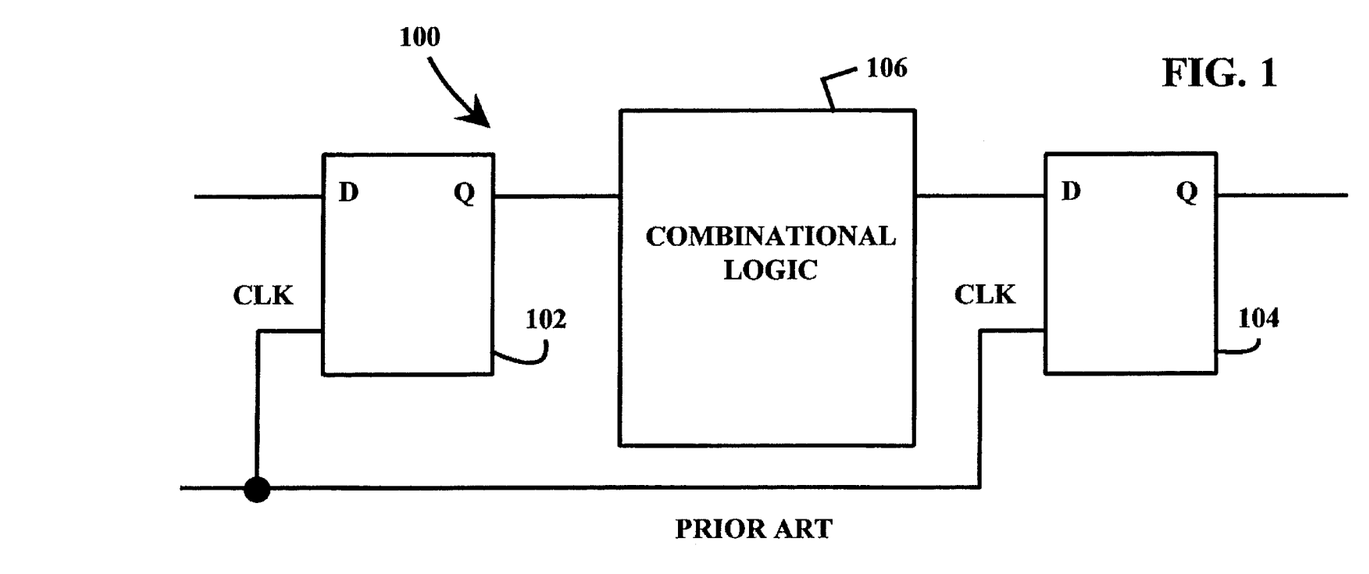
FIGS. 1 and 2 respectively illustrate a block diagram and a timing diagram of a prior art single-clock-edge triggered system.
Figure 2:
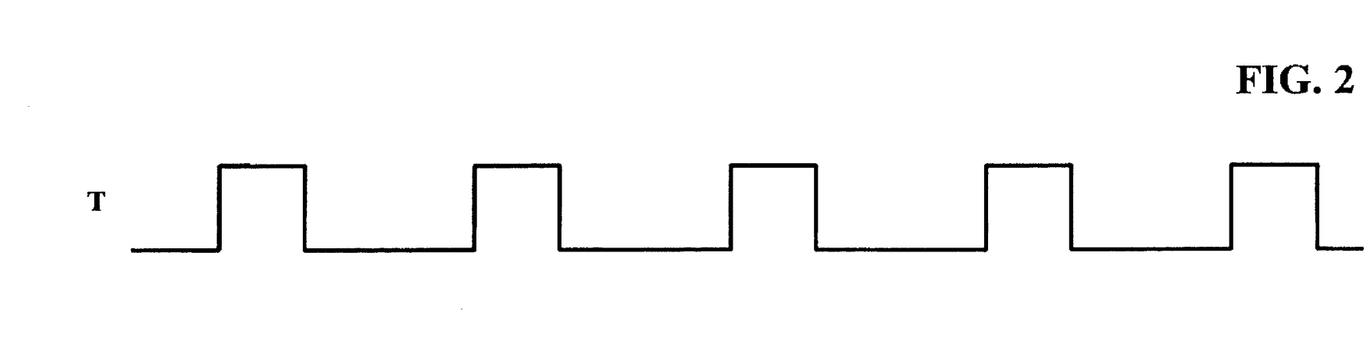

Certain simulators, emulators and verification tools update system changes on clock cycle by clock cycle basis. These tools, called cycle-based, edge-triggered, latched or edge-based systems, pass information on the falling or rising edge of a clock signal. These tools accurately reflect the performance of the circuit design by allowing only very simple clocking arrangements, usually a single-clock system which supports edge-triggered flip-flops. In a single clock edge trigger system, all sequential elements are updated during each clock cycle. Latches are inherently transparent so that changes to signals on input lines of a latch are immediately expressed on the latch output lines. A typical single-clock edge triggered system 100, shown in FIG. 1, employs edge-triggered flip-flops 102 and 104 as basic sequential circuit elements which control circuit timing of interspersed combinational logic 106. A single-clock edge triggered system 100 is timed using a simple single phase clocking scheme, which is depicted in FIG. 2. This clocking scheme does not allow clock gating.

An alternative to edge-based designs are level-sensitive designs. A level-sensitive device, also referred to as a transparent device, transfers information while the clock signal is active. A level-sensitive device updates its output information during the relatively long period of time of clock activity in contrast to an edge-triggered device which updates its output information during the small sampling of time that is centered around the edge of the clock signal.

Usage of typical edge-based simulation and emulation tools is advantageous for various reasons. Edge-based tools are simpler and therefore more efficiently perform each operation. Accordingly, edge-based tools emulate larger circuit designs and perform this emulation much more quickly.

Figure 3:
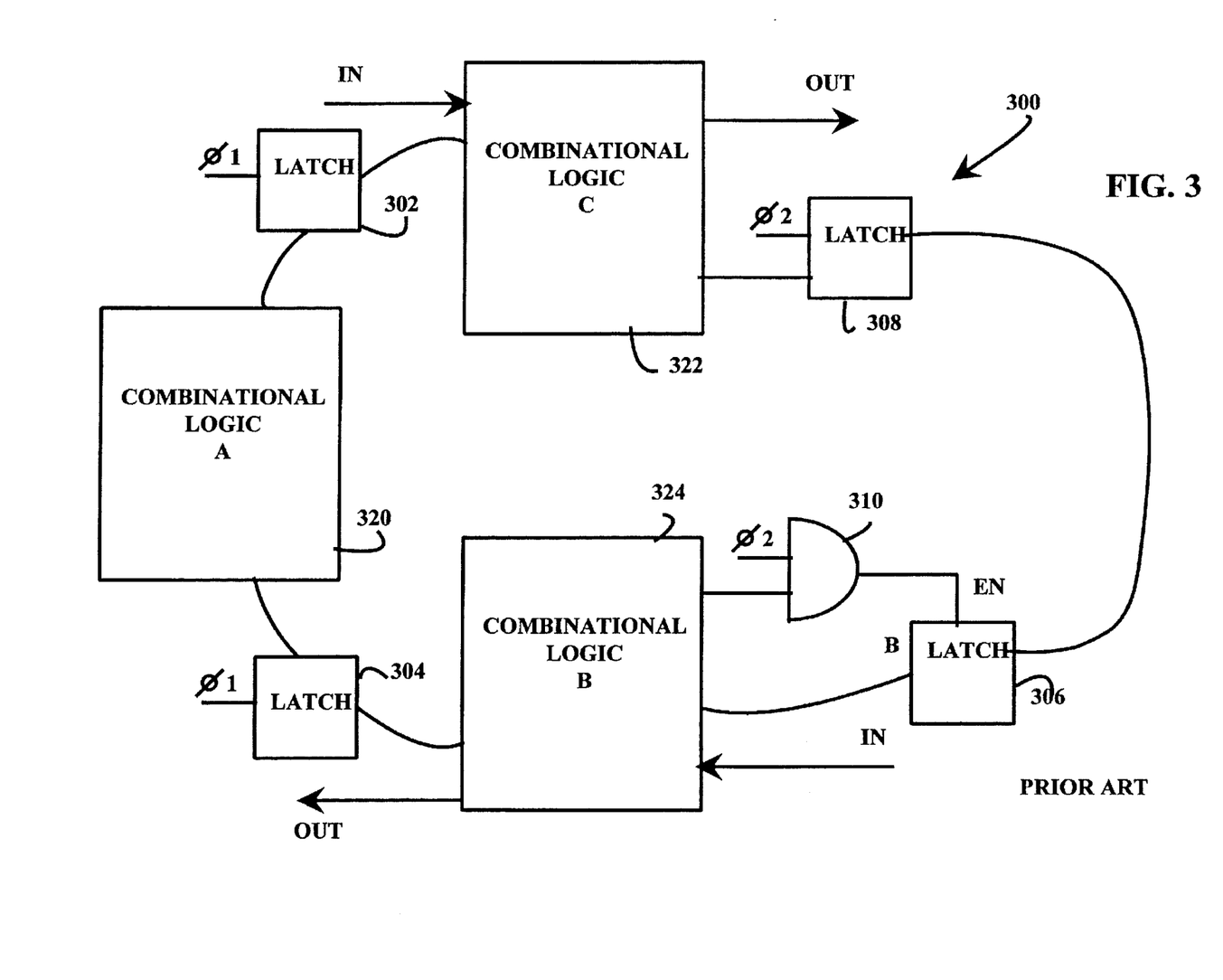
FIGS. 3, 4A, and 4B respectively illustrate a block diagram and a timing diagram of a prior art multiple-phase system.
Figure 4A:
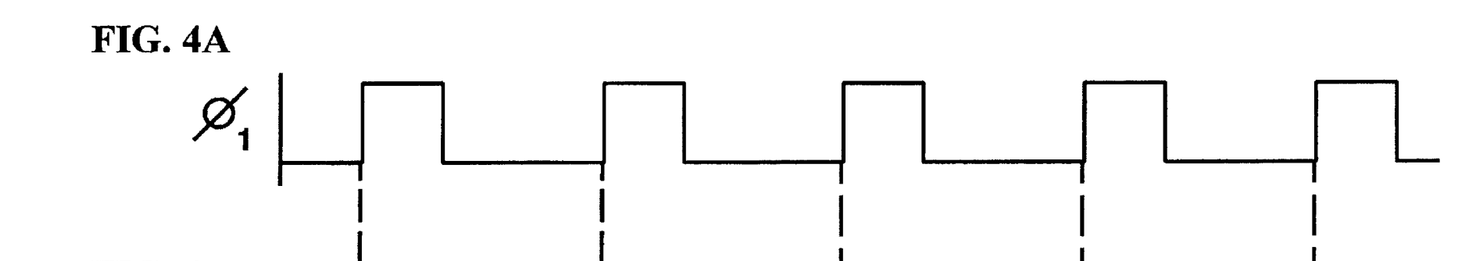
Figure 4B:
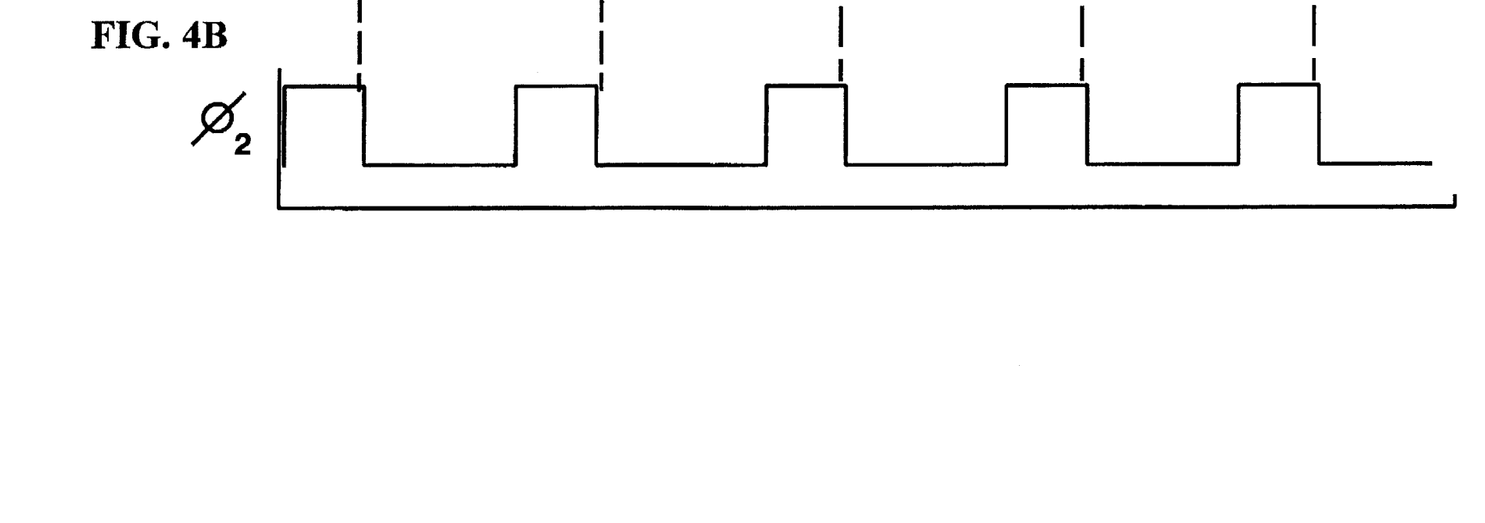

Large microprocessors and other complex system designs operate on a multiple-phase clock, resulting in an enhanced performance. In a multi-phase clock system, sequential elements are conditionally updated on selected phases of a clock cycle. A multi-phase clock based system 300, shown in FIG. 3, advantageously uses multiple clock edges generated by out-of-phase clock signals of a single clock cycle to drive combinational logic blocks, for example combinational logic blocks 320, 322 and 324, in higher performance circuits. Various enhancements are made to achieve system improvements. For example, back-to-back latches of the same phase 302 and 304, or a latch 306 which is updated on a specific conditional signal (for example, a condition signal from combinational logic block B 324 which is AND gated with an phase clock signal using AND gate 310) are implemented to reduce the number of circuit elements in a system, thereby reducing the size of the system 300. A multiple-phase clock system 300 is timed using a multiple-phase clocking scheme, which is depicted in a timing diagram shown in FIG. 4A and FIG. 4B.

Unfortunately the multiphase functionality of such complex systems typically does not allow simulation or emulation on a single-clock-edge based tool. In multiple-phase circuit operation, certain elements are updated only on particular phase clock edges. However, in a single-clock-edge based tool all sequential elements must be updated during each clock cycle. Furthermore, conditional updating of latches, which is extremely useful in a multiple-phase design, is not supported in a single-clock-edge based system because such updating violates the requirement that all sequential elements are updated on every designated transition of a clock edge.

SUMMARY OF THE INVENTION

The present invention advantageously converts a multiple-phase circuit to a single-clock-edge circuit.

The present invention advantageously emulates a multiple-phase circuit using a single-clock-edge test system such as a circuit emulators, simulators, cycle-based simulators, event-driven simulators. The speed of the test system is greatly accelerated by avoiding "dead" time between clock edges during which various circuits are idle.

Furthermore, the present invention implements logic condition signals which determine whether a latch is loaded. Conditional updating of sequential elements is prohibited in a conventional edge-based system.

Additionally, the present invention implements back-to-back latches in which sequential elements enabled by the same phase clock are connected by combinational logic and updated simultaneously within a single phase cycle. Back-to-back connection of sequential elements is prohibited in a conventional edge-based system.

Thus in accordance with a first embodiment, an apparatus converts a multiple-phase circuit to a single-clock-edge circuit. The apparatus includes a first control switch having a data terminal connected to receive a data signal, a feedback terminal connected to receive a feedback signal, a control terminal connected to receive a phase clock signal having a phase clock frequency and an output terminal. The apparatus also includes a latch having an input terminal connected to the first control switch output terminal, an output terminal supplying a latched data signal connected to the first control switch feedback terminal and a clock terminal connected to receive a system clock signal having a system clock frequency which is a multiple of the phase clock frequency. The apparatus further includes a second control switch having a first data terminal connected to receive the data signal, a second data terminal connected to the output terminal of the latch, a control terminal connected to receive the phase clock signal and an output terminal.

In accordance with a second embodiment, there is furnished a method for converting a multiple-phase circuit to a single-clock-edge circuit which includes the steps of receiving a data signal at an input terminal, receiving a system clock signal having a system clock frequency and receiving a phase clock signal having a frequency divided from the system clock frequency. The data signal is transferred to an output terminal when the phase clock signal is active and latched upon the occurrence of an edge transition of the system clock signal when the phase clock signal is active. When the phase clock signal is inactive, the latched data signal is latched again upon the occurrence of the edge transition of the system clock signal. The latched data signal is transferred to the output terminal when the phase clock signal is inactive.

BRIEF DESCRIPTION OF THE DRAWINGS

In the figures, in which like reference characters indicate like parts.

DETAILED DESCRIPTION OF THE PREFERRED EMBODIMENT

Figure 5:
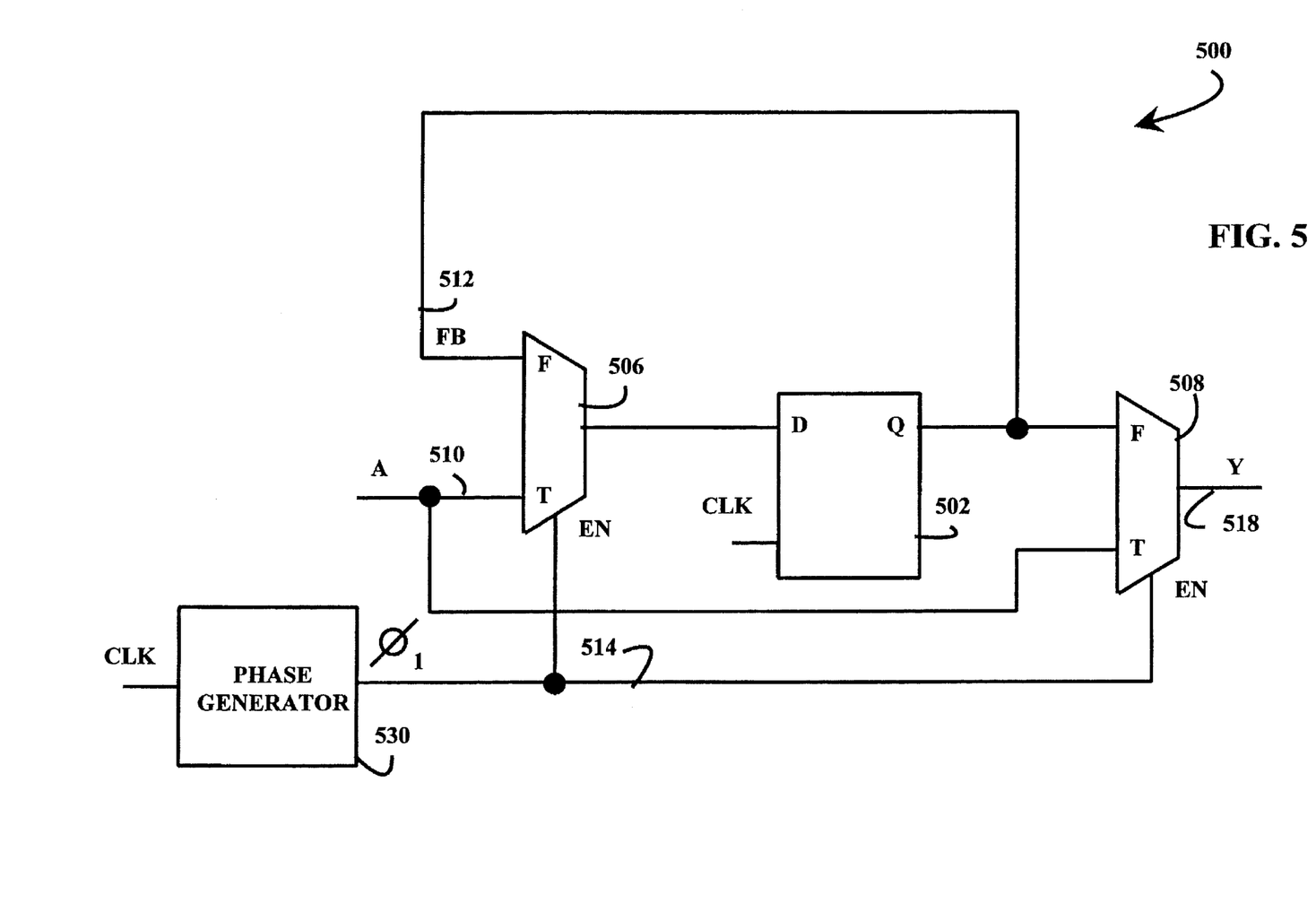
FIG. 5 illustrates a circuit diagram of a multiple-phase latch mapping circuit in accordance with the present invention.

Referring to FIG. 5, a multiple-phase latch mapping circuit 500 for converting a multiple-phase circuit to a single-clock-edge circuit or for emulating a multiple-phase circuit using a single-clock-edge simulator includes an edge-sensitive flip-flop 502, an input multiplexer 506 and a output multiplexer 508. Input signals to the multiple-phase latch mapping circuit 500 include an A signal on an A input line 510 and a phase clock signal via a control line 514. An output signal Y is generated by the multiple-phase latch mapping circuit 500 and furnished on an output line 518. A phase generator 530 generates a phase clock signal from a system clock signal.

The multiple-phase latch mapping circuit 500 is used to convert a multiple-phase circuit to a single-clock-edge triggered circuit. Alternatively, the multiple-phase latch mapping circuit 500 is used to emulate a multiple-phase circuit in a single-clock-edge triggered test system such as circuit emulators, simulators, cycle-based simulators, event-driven simulators.

The input multiplexer 506 serves as a first control switch which receives two data signals including the A signal on A input line 510 and a feedback signal on feedback line 512. The input multiplexer 506 receives the phase clock signal, which serves as an enable signal, on control line 514. The input multiplexer 506 passes a signal selected between the A signal and the feedback signal to the D input terminal of edge-sensitive flip-flop 502. The enable signal on control signal 514 determines whether the input multiplexer 506 passes the A signal or the feedback signal to the edge-sensitive flip-flop 502. For example, when the enable signal is a logic "1" the input multiplexer 506 transfers the A signal to the D input terminal of edge-sensitive flip-flop 502. Otherwise, the feedback signal is selected and applied to the D input terminal of edge-sensitive flip-flop 502.

The edge-sensitive flip-flop 502 is a D flip-flop which passes a signal which is received on a D input terminal to a Q output terminal when a rising edge is detected on a clock input CLK of the D flip-flop. In the illustrative embodiment of the circuit 500, the clock signal applied to the clock input CLK is a system clock signal having a frequency which is a multiple of the phase clock signal frequency. For example, in some embodiments the system clock frequency is twice the phase clock frequency. The edge-sensitive flip-flop 502 serves to hold the level of a signal which is associated with a particular phase, for example phase $\phi_1$, of a multi-phase clock system throughout a full cycle of the phase $\phi_1$, despite multiple intervening system clock transitions. A typical circuit or simulation of a circuit includes several multiple-phase latch mapping circuits 500.

The output multiplexer 508 serves as a second control switch which receives two data signals including the A signal on input line 510 and a signal received from the Q output terminal of edge-sensitive flip-flop 502. The output multiplexer 508, like the input multiplexer 506, is controlled by the enabling phase clock signal on control line 514. The output multiplexer 508 generates a Y signal, an output signal of the multiple-phase latch mapping circuit 500, on output line 518. The enable signal on control line 514 controls the transfer, by output multiplexer 508, of either the A signal 510 or the signal from the Q output terminal of the edge-sensitive flip-flop 502 to the output line 518. For example, the output multiplexer 508 generates the Y signal on output line 518 which is equal to the A signal when the enable signal on control line 514 is a logic "1" and which is equal to the signal on the Q output terminal of the edge-sensitive flip-flop 502, otherwise.

The signal from the Q output terminal of the edge-sensitive flip-flop 502, in addition to being communicated to an input terminal of the output multiplexer 508, is fed back to feedback line 512 as the feedback signal to the input multiplexer 506.

The edge-sensitive flip-flop 502 is a latch which is typically used in a single-clock-edge triggered circuit. Such a latch has an input terminal, an output terminal and an enable terminal. A signal at the input terminal is passed to the output terminal on a selected edge of the a clock signal, for example the falling edge of the clock signal, which is applied to the enable terminal. To convert a multiple-phase circuit such as multiple-phase latch mapping circuits 500 to a single-clock-edge triggered circuit, the input multiplexer 506 is applied to the input terminal of the edge-sensitive flip-flop 502 and the output multiplexer 508 is applied to the output terminal of the edge-sensitive flip-flop 502. The output multiplexer 508 selects the A signal on input line 510 for transfer to output line 518 when the enable signal on control line 514 is activated, for example a data "1".

When the enable signal on control line 514 is inactivated, for example by a data "0" value, the data value that was last latched into the edge-sensitive flip-flop 502 by the edge of the system clock signal. Thus, even though a suitable A signal is not available on input line 510 when the enable signal is inactivated, appropriate data is available via storage by the edge-sensitive flip-flop 502.

Figure 6:
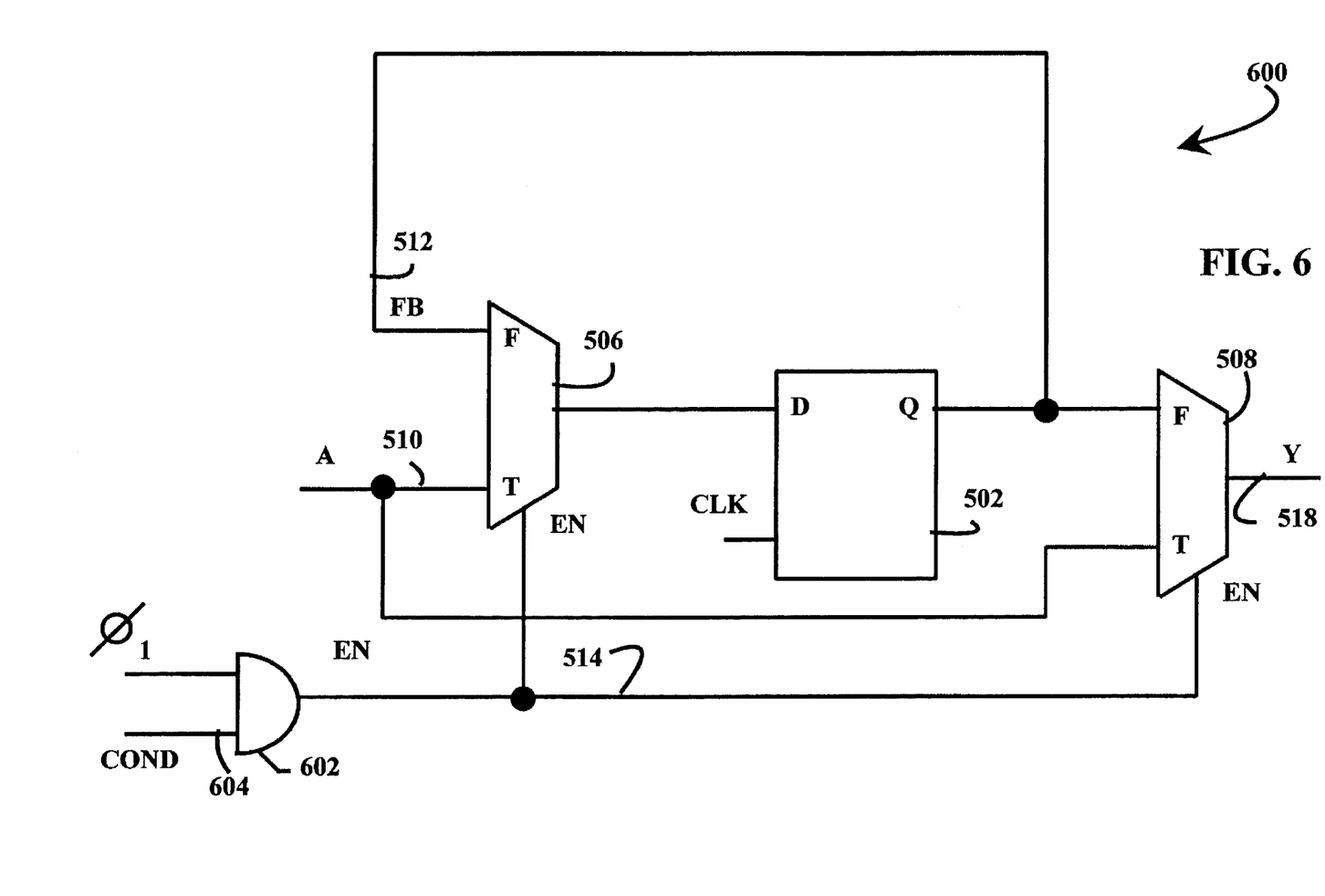
FIG. 6 illustrates a circuit diagram of a conditional multiple-phase latch mapping circuit in accordance with the present invention.

Referring to FIG. 6, an embodiment of a conditional latch mapping circuit 600 is shown which includes all of elements of the multiple-phase latch mapping circuit 500 and further incorporates an AND gate 602. AND gate 602 furnishes conditional activation of an input signal to selection switch multiplexers 506 and 508. The AND gate 602 is connected to receive two input signals, a phase signal $\phi_1$ and a conditional signal on conditional input line 604. The AND gate 602 generates an enable signal EN on control line 514, which conveys the result from AND gate 602 to control terminals of input multiplexer 506 and output multiplexer 508. Thus, logical condition signals are used to control conditional loading of the edge-sensitive flip-flop 502 while the edge-sensitive latch continues to update on each system clock cycle. In this manner, the practical limitation of edge-based systems prohibiting conditional operation, is avoided.

The logical condition signal on conditional input line 604 is supplied from various sources. Combinational logic typically supplies the logical conditional signal. However, external signals and other suitable signals are commonly used as logical condition signals.

A typical circuit or emulation of a circuit includes several conditional latch mapping circuits 600. In this manner, conditional latch mapping circuits 600 are updated in accordance with specific conditional signals with the timing of such updating appropriately controlled with respect to multiple phase timing signals.

Figure 7:
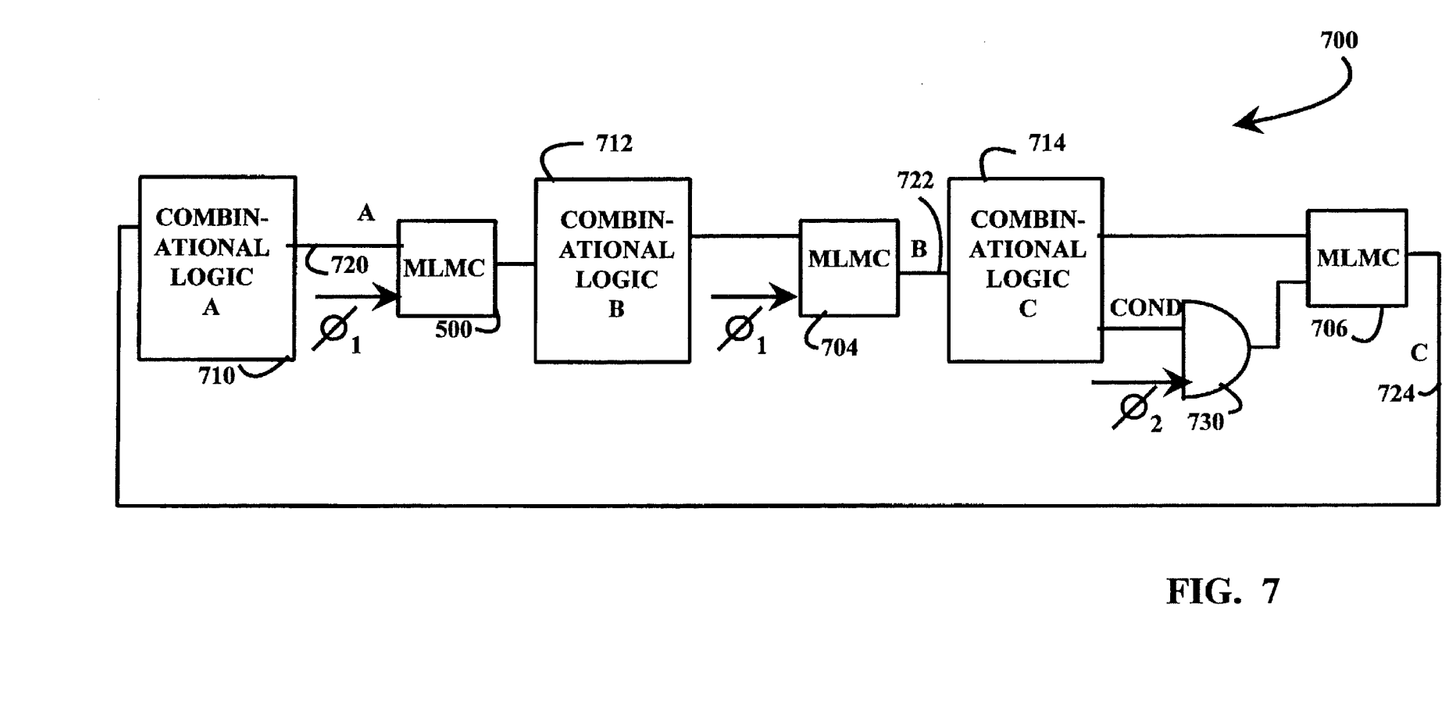
FIG. 7 depicts an example of a portion of a circuit including various multiple-phase latch mapping circuits and having interspersed combinational logic circuits.
Figure 8A:
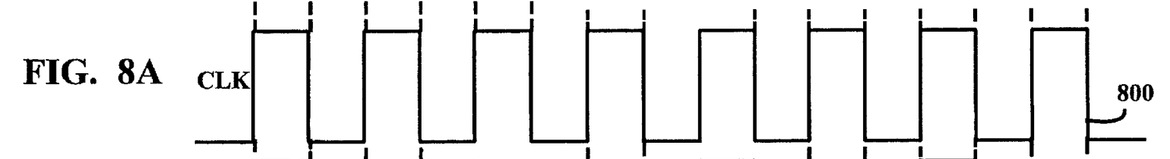
FIGS. 8A through 8F is a timing diagram which illustrates exemplary signals on various lines of the circuit portion shown in FIG. 7.
Figure 8B:
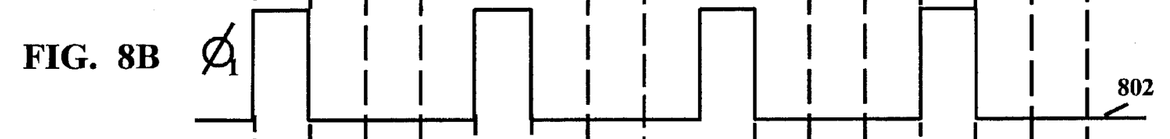
Figure 8C:
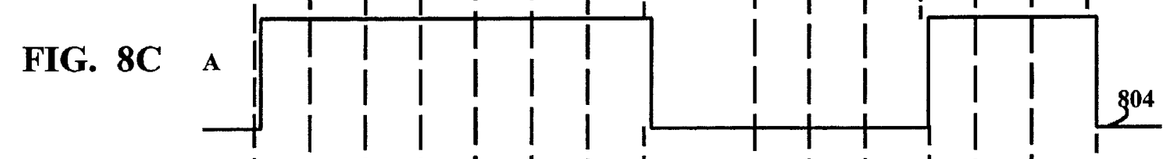
Figure 8D:
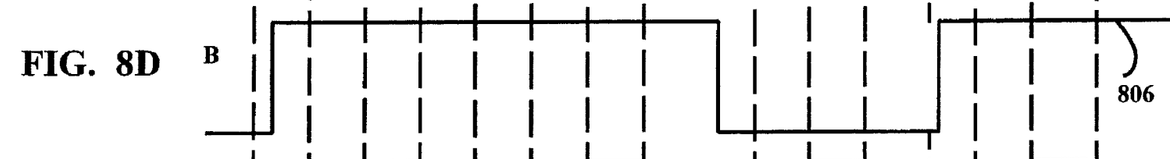
Figure 8E:
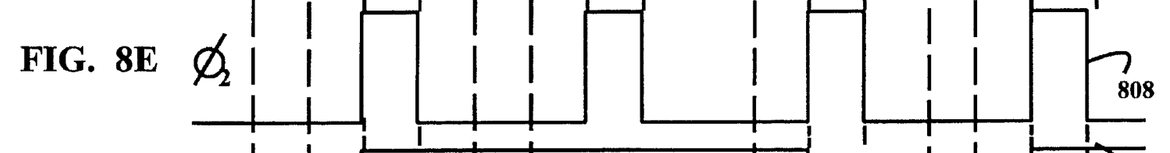
Figure 8F:
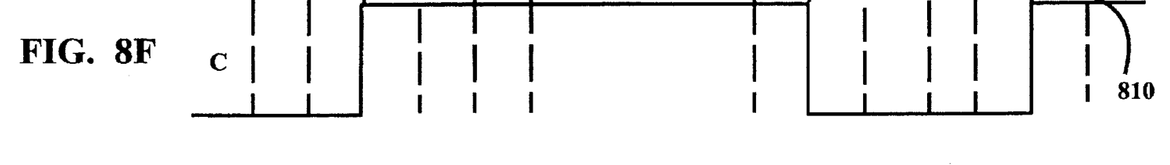

FIG. 7 illustrates an example of a portion of a circuit 700 which includes various multiple-phase latch mapping circuits 500, 704 and 706. The multiple-phase latch mapping circuit 500 is also depicted in FIG. 5. The circuit portion 700 also includes interspersed combinational logic circuits A 710, B 712 and C 714. Two phases, $\phi_1$ and $\phi_2$, of a multi-phase clock signal are routed as data signals to various circuits of multiple-phase latch mapping circuits 500, 704 and 706. Two of the multiple-phase latch mapping circuits 500 and 704 are actuated by the $\phi_1$ signal. Multiple-phase latch mapping circuit 706 is conditionally actuated by the $\phi_2$ signal. In the exemplary circuit 700, the conditional signal upon which the response of conditional latch 706 is dependent is generated by circuits within combinational logic circuit C 714. In other exemplary embodiments, conditional signals may be generated in any suitable manner and may arise externally with respect to the circuit 700.

With regard to the multiple-phase operation of circuit 700, under control of multiple-phase latch mapping circuit 500 a transition of signal A on a signal line 720 is applied to combinational logic B 712 upon the occurrence of a designated level of phase $\phi_1$ signal, for example a logic "1" level. Combinational logic B 712 generates a signal which is applied to combinational logic C 714 through the operation of multiple-phase latch mapping circuit 704 which propagates the signal from combinational logic block B 712 to a signal line 722. Combinational logic C 714 generates a signal C on signal line 724 and a condition signal COND. The condition signal COND and phase $\phi_2$ signal are applied to AND gate 730 and the result of the AND operation is applied as an enable signal to multiple-phase latch mapping circuit 706. Signal C on signal line 724 is propagated to the output of circuit 706 upon the occurrence of a designated level of phase $\phi_2$ signal, for example the logic "1" level (provided the COND is true) and applied to the combinational logic A 710 to generate the signal A on signal line 720. This propagation of signals occurs in one cycle of each phase clock $\phi_1$ and $\phi_2$.

Latch mapping circuits 500 and 704 include latches which are considered "back-to-back" latches in which two phase $\phi_1$ sequential elements are connected by combinational logic. Thus, the two phase $\phi_1$ sequential elements are updated simultaneously within a single phase cycle.

An exemplary circuit (not shown) which is similar to the circuit 700, wherein a phase $\phi_1$ timing signal is applied to mapping circuit 706, achieves a circuit in which all signals A, B and C are updated during the same phase cycle. A circuit or emulated circuit which operates in this manner is much faster than a system which steps through a chain of sequential logic one block per cycle.

Referring to FIGS. 5 and 7, a timing diagram in FIGS. 8A through 8F illustrates exemplary signals on various lines of the circuit portion 700 shown in FIG. 7. The circuit portion 700 includes a plurality circuits which are the same as the multiple-phase latch mapping circuit 500 shown in FIG. 5. A high frequency system clock signal (CLK) 800 supplies the system clock input signal to edge-sensitive flip-flop 502. A phase one ($\phi_1$) signal 802 is the enable signal on control line and is applied to control the selection multiplexers 506 and 508. A signal 804 is applied on A input line 510 to the input terminals of the selection multiplexers 506 and 508. Signal 804 is clocked into the flip-flop 502 upon the falling edge of the system clock CLK 800 to provide a feedback signal (not shown), which is communicated on the feedback line 512 and applied to the feedback input terminal of input multiplexer 506. An output signal Y is generated by the multiple-phase latch mapping circuit 500 in response to the input signal A 804 and the enable signal $\phi_1$ 802 and is applied to combinational logic block B 712. The state of the output signal Y is maintained by flip-flop 502 after the enable signal $\phi_1$ returns to logical 0. Combinational logic block B 712 generates a signal which is propagated by latch mapping circuit 704 to generate the signal B 806 on B signal line 722. Signal B 806 reflects signal transitions of signal A 804.

In this example, the high frequency system clock signal 800 is divided into two phases $\phi_1$ 802 and $\phi_2$ 808. One rising edge of the system clock corresponds to the phase $\phi_1$ signal 802. The subsequent rising edge of the system clock corresponds to the phase $\phi_2$ signal 808 and phase signals $\phi_1$ and $\phi_2$ alternate thereafter. Each of phase $\phi_1$ signal 802 and phase $\phi_2$ signal 808 has a frequency which is half the high frequency system clock signal 800. The two phase signals $\phi_1$ and $\phi_2$ have a mutual phase difference of 180°. Two phases are illustrated for simplicity of explanation. It is to be understood that the multiple-phase latch mapping circuit 500 operates in the same manner for additional multiples of clock phases.

Edge-sensitive flip-flop 502 latches the signal selected by input multiplexer 506 on every falling edge of the system clock signal 800. This latched signal at the Q output terminal of edge-sensitive flip-flop 502 is immediately fed back to the input multiplexer 506. The input multiplexer 506 selects the input signal A 804 when the phase $\phi_1$ signal is a logic "1" and otherwise selects the signal on the feedback line 512.

Thus, the edge-sensitive flip-flop 502 fulfills the requirement of an edge-based system that all sequential elements are updated on every system clock cycle. However, the data value on the output signal line 518 is latched and thereby held for the duration of the phase $\phi_1$ cycle so that multiple-phase operation is achieved. Similarly, conditional updating of latches is achieved in the manner shown in FIG. 6 and by the AND gate 730 shown in FIG. 7 by ANDing the phase signal, such as phase $\phi_1$ signal, with a conditional signal so that the system clock signal continuously updates all sequential elements on every designated transition of a clock edge.

When the A signal 804 is a logic "0" for a full cycle of the $\phi_1$ clock or more, the multiple-phase latch mapping circuit 500 is placed in a condition in which the A signal 804 and the feedback signal are a logic "0". When the A signal 804 takes the value of a logic "1", input multiplexer 506, when actuated by a logic "1" level of the $\phi_1$ signal 802, passes the A signal logic "1" value to the D terminal of edge-sensitive flip-flop 502. At the same time, output multiplexer 508, which is also actuated by the logic "1" level of the $\phi_1$ signal 802, passes the A signal logic "1" value to the output terminal 518 to communicate the output signal Y.

Edge-sensitive flip-flop 502 latches the A signal logic "1" on the falling edge of the system clock signal 800, thereby passing the A signal logic "1" to the Q output terminal. At this time, $\phi_1$ signal 802 takes the value of a logic "0" so that the signal passed by output multiplexer 508 is the logic "1" from the Q output terminal of the edge-sensitive flip-flop 502. In this manner, output signal Y expresses a logic "1" value for two half-cycles of high frequency system clock signal (CLK) 800.

The logic "1" data value from the edge-sensitive flip-flop 502 Q output terminal is communicated to the input multiplexer 506 on feedback line 512, which applies feedback signal to the D terminal of edge-sensitive flip-flop 502 since $\phi_1$ signal 882 has a logic "0" value. The logic "1" of feedback signal is thereby passed to output multiplexer 508 and output terminal 518 as output signal Y. In this manner, an A signal 804 is held for a full cycle of high frequency system clock signal (CLK) 800. Output signal Y holds a particular logic level until the alternative logic level is presented on A signal 804 and actuated by $\phi_1$ signal 802.

An output signal B 806 generated by the multiple-phase latch mapping circuit 704 in response to the output of combinational logic B 712 and enable signal $\phi_1$ 802 is applied to combinational logic block C 714. Combinational logic block C furnishes a data signal to multiple-phase latch mapping circuit 706, which generates a signal C 810 on C signal line 724. Signal C 810 reflects signal transitions of signal B 806 as processed in combinational logic C 714 and shifted by about a 180° phase delay resulting from application of the phase $\phi_2$ signal 808 to the mapping circuit 786. Signal C 810 is the depicted result when the condition signal COND is assumed to have the value of a logic "1" and thus enables the mapping circuit 706.

While the invention has been described with reference to various embodiments, it will be understood that these embodiments are illustrative and that the scope of the invention is not limited to them. Variations, modifications, additions and improvements of the embodiments described are possible. The illustrative embodiments are applicable to circuits as well as to emulation systems, simulation systems and other test systems. The number, arrangement and interconnection of latches may be varied. Moreover, various numbers of phases may be employed in a multi-phase circuit. In addition, Furthermore, the logic level "0" and logic level "1" may be interchanged for most of the circuits. Furthermore, although the illustrative embodiment shows a system clock which is divided into only two phases, $\phi_1$ and $\phi_2$, to simplify the description of the multiple-phase latch mapping circuit, the system clock may also be divided into additional phase clock signals $\phi_3$ to $\phi_n$, where n is an arbitrary positive integer. These and other variations, modifications, additions and improvements may fall within the scope of the invention as defined in the claims which follow.

We claim:

1. A simulator circuit for simulating a multiple-phase circuit using a single-clock-edge system comprising:

a data node;

a system clock node;

a phase generator having an input terminal coupled to the system clock node and an output terminal;

a first control switch having a first input terminal coupled to the data node, a second input terminal, a control terminal coupled to the output terminal of the phase generator and an output terminal;

a latch having an input terminal coupled to the first control switch output terminal, an output terminal coupled to the first input terminal of the first control switch and a clock terminal coupled to the system clock node; and a second control switch having a first input terminal coupled to the data node, a second input terminal coupled to the output terminal of the latch, a control terminal coupled to the output terminal of the phase generator and an output terminal.

2. A circuit as in claim 1 further comprising:

a condition signal node;

an AND gate having a first input terminal coupled to the output terminal of the phase generator, a second input terminal coupled to the condition signal node and an output terminal coupled to the control terminals of the first and second control switches.

3. A circuit according to claim 1 wherein the first and second control switches are multiplexers.

4. A circuit according to claim 1 wherein the latch is a D flip-flop.

5. A sequential logic circuit comprising:

a data node;

a system clock node;

a phase generator having an input terminal coupled to the system clock node and an output terminal;

a first multiple-phase latch mapping circuit having a data input terminal coupled to the data node, an enable terminal coupled to the output terminal of the phase generator and an output terminal;

a combinational logic block having an input terminal coupled to the output terminal of the first multiple-phase latch mapping circuit and having an output terminal; and a second multiple-phase latch mapping circuit having a data input terminal coupled to the output terminal of the combinational logic block, an enable terminal coupled to the output terminal of the phase generator and an output terminal.

6. A circuit as in claim 5 wherein the first multiple-phase latch mapping circuit comprises:

a first control switch having a first input terminal coupled to the data node, a second input terminal, a control terminal coupled to the output terminal of the phase generator and an output terminal;

a latch having an input terminal coupled to the first control switch output terminal, an output terminal coupled to the first input terminal of the first control switch and a clock terminal coupled to the system clock node; and a second control switch having a first input terminal coupled to the data node, a second input terminal coupled to the output terminal of the latch, a control terminal coupled to the output terminal of the phase generator and an output terminal.

7. A circuit according to claim 6 wherein the first and second control switches are multiplexers.

8. A circuit according to claim 6 wherein the latch is a D flip-flop.

9. A circuit as in claim 5 further comprising:

a condition signal node;

an AND gate having a first input terminal coupled to the output terminal of the phase generator, a second input terminal coupled to the condition signal node and an output terminal coupled to the control terminals of the first and second control switches.

10. An apparatus for converting a multiple-phase circuit to a single-clock-edge circuit comprising:

a first control switch having a first input terminal coupled to a data node, a second input terminal, a control terminal coupled to receive a phase clock signal having a phase clock frequency and an output terminal;

a latch having an input terminal coupled to the first control switch output terminal, an output terminal coupled to the first input terminal of the first control switch and a clock terminal coupled to receive a system clock signal having a system clock frequency which is a multiple of the phase clock frequency; and a second control switch having a first input terminal coupled to the data node, a second input terminal coupled to the output terminal of the latch, a control terminal coupled to receive the phase clock signal and an output terminal.

11. An apparatus according to claim 10 wherein the first control switch passes a signal from the first control switch first input terminal to the first control switch output terminal when the phase clock signal is active and passes a signal from the first control switch second input terminal to the first control switch output terminal when the phase clock signal is inactive.

12. An apparatus according to claim 11 wherein the second control switch passes a signal from the second control switch first input terminal to the second control switch output terminal when the phase clock signal is active and passes a signal from the second control switch second input terminal to the second control switch output terminal when the phase clock is inactive.

13. An apparatus according to claim 10 wherein the second control switch passes a signal from the second control switch first input terminal to the second control switch output terminal when the phase clock signal is active and passes a signal from the second control switch second input terminal to the second control switch output terminal when the phase clock is inactive.

14. An apparatus according to claim 10 wherein the latch latches data on the input terminal on an edge of the system clock signal.

15. An apparatus according to claim 10 wherein the apparatus is an emulated circuit for emulating a multiple-phase circuit using a single-clock-edge triggered test system.

16. An apparatus according to claim 15 wherein the single-clock-edge triggered test system is a system selected from the group of circuit emulators, simulators, cycle-based simulators, event-driven simulators.

17. An apparatus according to claim 10 wherein the first and second control switches are multiplexers.

18. An apparatus according to claim 10 wherein the latch is a D flip-flop.

19. An apparatus according to claim 10 wherein the phase clock signal is a conditional signal and the apparatus further comprises:

an AND gate having a first input terminal coupled to receive a condition signal, a second input terminal coupled to receive an unconditional phase clock signal and an output terminal coupled to the first control switch control terminal and the second control switch control terminal to supply the conditional phase clock signal.

20. An apparatus for converting a multiple-phase circuit to a single-clock-edge circuit comprising:

an input multiplexer controlled by a phase clock signal having a phase clock frequency for selecting an input signal between a data signal and a feedback signal;

a flip-flop coupled to the input multiplexer to receive the input signal and controlled by a system clock signal having a system clock frequency which is a multiple of the phase clock frequency for latching the input signal on a clock edge of the system clock signal; and an output multiplexer controlled by the phase clock signal for selecting an output signal between the data signal and the latched signal, the latched signal being fed back to the input multiplexer as the feedback signal.

21. An apparatus according to claim 20 wherein the phase clock signal is a conditional signal further comprising:

an AND gate for ANDing a condition signal with an unconditional phase clock signal supplying the conditional phase clock signal result to the input multiplexer and the output multiplexer.

22. An apparatus according to claim 20 wherein the apparatus is an emulated circuit for emulating a multiple-phase circuit in a single-clock-edge triggered test system selected from the group of circuit emulators, simulators, cycle-based simulators, event-driven simulators.

23. A system for converting the operation of a multiple-phase, level-sensitive transparent device to an edge-sensitive operation comprising:

an input switch having a first input terminal coupled to the multiple-phase, level-sensitive transparent device for receiving an operating signal, having a second input terminal for receiving a feedback signal, having a control terminal for receiving a phase signal of a multiple-phase timing signal, and having an output terminal;

an edge-sensitive trigger device having an input terminal coupled to the output terminal of the input switch, having a control terminal coupled to receive a system clock signal, and having an output terminal coupled to the second input terminal of the input switch for supplying a feedback signal; and an output switch having a first input terminal coupled to the multiple-phase, level-sensitive transparent device for receiving an operating signal, having a second input terminal coupled to the output terminal of the edge-sensitive trigger device, having a control terminal for receiving the phase signal of the multiple-phase timing signal, and having an output terminal for generating an edge-sensitive output signal synchronous with the system clock signal.

24. A system according to claim 23 wherein the input and output switches are multiplexers.

25. A system according to claim 23 wherein the edge-sensitive trigger device is a latch.

26. A system according to claim 23 wherein the edge-sensitive trigger device is a D flip-flop.

27. A system according to claim 23 wherein the input switch passes the operating signal from the input switch first input terminal to the input switch output terminal when the phase clock signal is active and passes the feedback signal from the input switch second input terminal to the input switch output terminal when the phase clock signal is inactive.

28. A system according to claim 27 wherein the output switch passes the operating signal from the output switch first input terminal to the output switch output terminal when the phase clock signal is active and passes the edge-sensitive trigger device output signal from the output switch second input terminal to the output switch output terminal when the phase clock is inactive.

29. A system according to claim 23 wherein the output switch passes the operating signal from the output switch first input terminal to the output switch output terminal when the phase clock signal is active and passes the edge-sensitive trigger device output signal from the output switch second input terminal to the output switch output terminal when the phase clock is inactive.

30. A system according to claim 23 wherein the edge-sensitive trigger device latches data on the input terminal on an edge of the system clock signal.

31. A system according to claim 23 wherein the system is an emulated circuit for emulating a multiple-phase circuit using a single-clock-edge triggered test system.

32. A system according to claim 31 wherein the single-clock-edge triggered test system is a system selected from the group of circuit emulators, simulators, cycle-based simulators, event-driven simulators.

33. A system according to claim 31 wherein the phase signal is a conditional signal and the system further comprises:

an AND gate having a first input terminal coupled to receive a condition signal, a second input terminal coupled to receive an unconditional phase clock signal and an output terminal coupled to the input switch control terminal and the output switch control terminal to supply the conditional phase clock signal.

* * * * *